(12) United States Patent
Farmer et al.

(10) Patent No.: US 10,714,649 B2
(45) Date of Patent: *Jul. 14, 2020

(54) TRANSPARENT ULTRAVIOLET PHOTODETECTOR

(71) Applicant: International Business Machines Corporation, Armonk, NY (US)

(72) Inventors: Damon Farmer, White Plains, NY (US); Shu-Jen Han, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/590,912

(22) Filed: Oct. 2, 2019

(65) Prior Publication Data

US 2020/0035850 A1 Jan. 30, 2020

Related U.S. Application Data

(63) Continuation of application No. 15/994,510, filed on May 31, 2018, now Pat. No. 10,475,948.

(51) Int. Cl.
| | |
|---|---|
| *H01L 31/101* | (2006.01) |
| *H01L 31/0224* | (2006.01) |
| *H01L 31/18* | (2006.01) |
| *H01L 31/0296* | (2006.01) |
| *H01L 31/0352* | (2006.01) |

(52) U.S. Cl.
CPC ........ *H01L 31/101* (2013.01); *H01L 31/0224* (2013.01); *H01L 31/0296* (2013.01); *H01L 31/035209* (2013.01); *H01L 31/1828* (2013.01)

(58) Field of Classification Search
None
See application file for complete search history.

(56) References Cited

U.S. PATENT DOCUMENTS 8,598,568 B2 12/2013 Kim et al.
8,729,528 B2 5/2014 Klem et al.
(Continued)

OTHER PUBLICATIONS

Ates et al., "Zinc Oxide Nanowire Photodetectors with Single-Walled Carbon Nanotube Thin-Film Electrodes", ACS Appl. Mater. Interfaces, 2012, 4 (10), Abstract, 1 page.
(Continued)

*Primary Examiner* — J. E. Schoenholtz
(74) *Attorney, Agent, or Firm* — Cantor Colburn LLP; Vazken Alexanian

(57) ABSTRACT

A method of fabricating a visibly transparent, ultraviolet (UV) photodetector is provided. The method includes laying a first electrode onto a substrate surface, the first electrode being formed of a carbon-based, single-layer material. A block is patterned over an end of the first electrode and portions of the substrate surface. The block is formed of a visibly transparent material that is able to be deposited into the block at 75° C.-125° C. In addition, the method includes masking a section of the block and exposed sections of the first electrode. A second electrode is laid onto an unmasked section of the block with an end of the second electrode laid onto the substrate surface. The second electrode is formed of the carbon-based, single-layer material.

13 Claims, 3 Drawing Sheets

(56) References Cited

U.S. PATENT DOCUMENTS

| | | | |
|---|---|---|---|
| 8,878,157 | B2 | 11/2014 | Wu et al. |
| 9,145,302 | B2 | 9/2015 | Choi et al. |
| 9,806,218 | B2 | 10/2017 | Heo et al. |
| 2013/0192666 | A1 | 8/2013 | Martorell Pena et al. |
| 2014/0054442 | A1 | 2/2014 | Huang et al. |
| 2015/0357485 | A1 | 12/2015 | Choi et al. |
| 2015/0380579 | A1 | 12/2015 | Kim et al. |
| 2016/0020280 | A1 | 1/2016 | Heo et al. |
| 2016/0027938 | A1 | 1/2016 | Stoica |
| 2016/0343891 | A1* | 11/2016 | Heo ................ H01L 31/035218 |
| 2018/0308941 | A1 | 10/2018 | Chang |

OTHER PUBLICATIONS

Dang et al., "High-Performance Flexible Ultraviolet (UV) Phototransistor Using Hybrid Channel of Vertical ZnO Nanorods and Graphene", Abstract, ACS applied materials & interfaces, 2015, 1 page.

Fu et al., "Graphene/ZnO nanowire/graphene vertical structure based fast-response ultraviolet photodetector", 2012, Applied Physics Letters, Abstract, 1 page.

Guo et al., "Highly Sensitive Ultraviolet Photodetectors Fabricated from ZnO Quantum Dots/Carbon Nanodots Hybrid Films", Scientific Reports, Article No. 7496, 2014, 6 pages.

Kim et al., "High-performance ultraviolet photodetectors based on solutiongrown ZnS nanobelts sandwiched between graphene layers", 2015,Scientific Reports, 8 pages.

Liang, S., et al. "ZnO Schottky Ultraviolet Photodetectors." Journal of Crystal Growth, vol. 225, No. 2-4, 2001, pp. 10-113., doi: 10.1016/s0022-0248(01)00830-2. (Year:2001).

Omkaram, Inturu, et al. "Transition Metal Dichalcogenide Photodetectors", Two-Dimensional Materials for Photodetector, 2018, doi:10.5772/intechopen.72295. (Year:2018).

Singh, Khomdram Jolson, et al. "ZnO Based Homojunction p-i-n. Solar Cell to Self-Power UV Detector." 2017 International Conference on Inventive Communication and Computational Technologies (ICICCT), 2017, doi:10.1109/icicct.2017.7975208. (Year:2017).

Tapily, Kandaabra, et al. "Growth Mechnism of ALD ZnO Films Investigated by Physical Characterization." 2010, doi:10.1149/1.3485271. (Year:2010).

Zang et al., "Characterization and modeling of a ZnO nanowire ultraviolet photodetector with graphene transparent contact", Journal of Applied Physics 114, 234505 (2013); doi: 10.1063/14854455, 10 pages.

Hasan et al., "Self-powered p-NiO/n-ZnO heterojunction ultraviolet photodetectors fabricated on plastic substrates", APL Materials, 2015, 8 pages.

Liu et al., "Ultraviolet photoconductive detector with high visible rejection and fast photoresponse based on ZnO thin film", ScienceDirect, 2007, pp. 757-761.

List of IBM Patents or Patent Applications Treated as Related; (Appendix P), Filed Oct. 2, 2019; 2 pages.

Damon Farmer et al., "Transparent Ultraviolet Photodetector", U.S. Appl. No. 15/994,510, filed May 31, 2018.

* cited by examiner

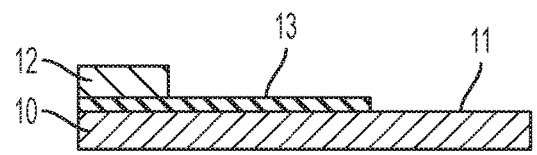
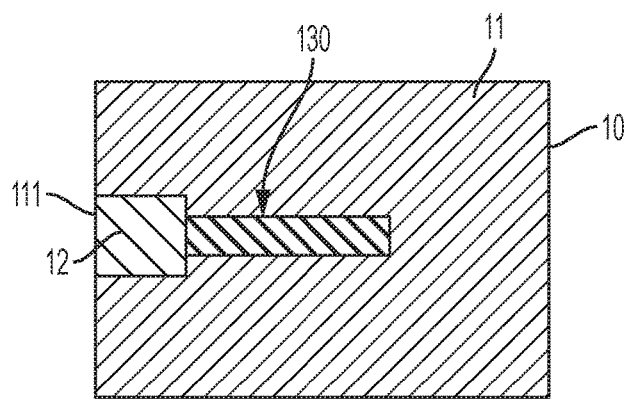
FIG. 1　　　　　FIG. 2
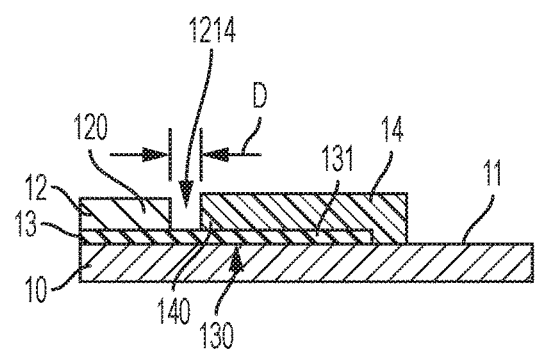
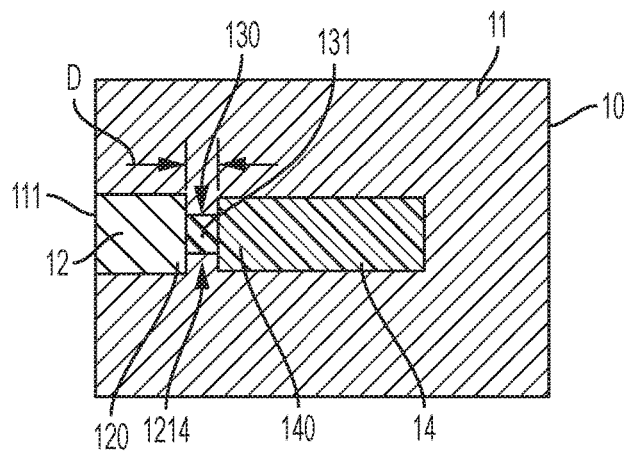
FIG. 3　　　　　FIG. 4
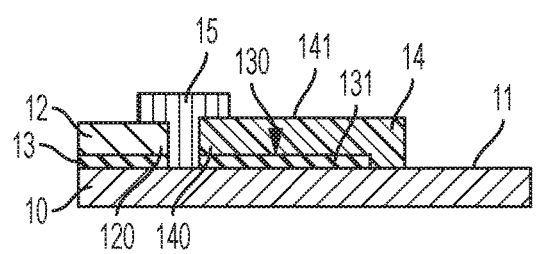
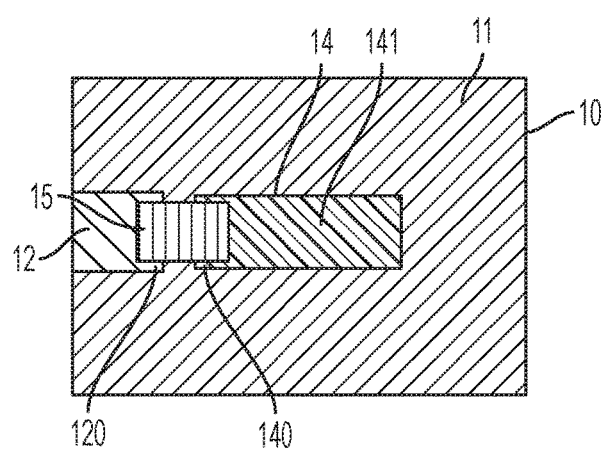
FIG. 5　　　　　FIG. 6

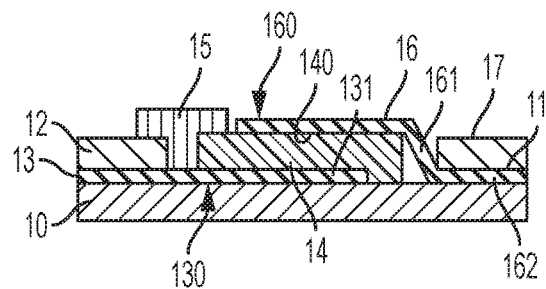
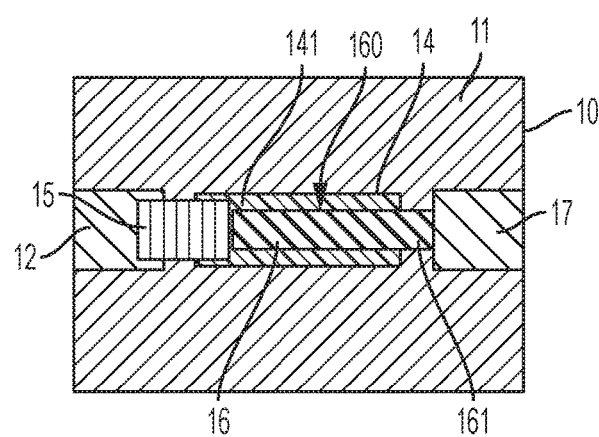
FIG. 7  FIG. 8
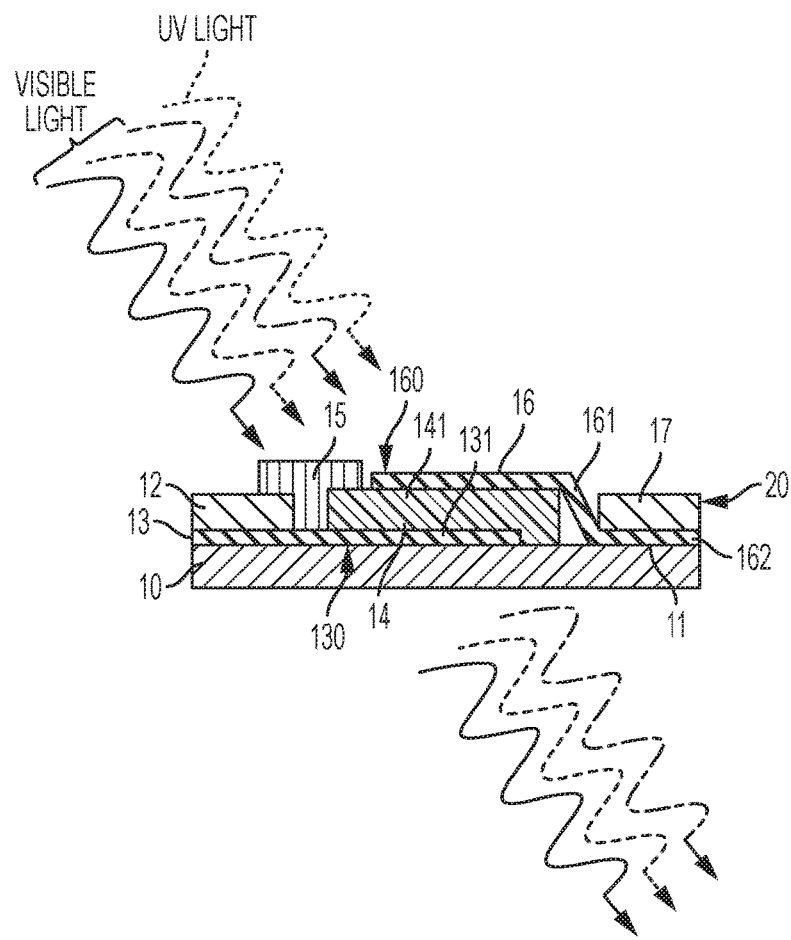
FIG. 9

TRANSPARENT ULTRAVIOLET PHOTODETECTOR

DOMESTIC PRIORITY

This application is a continuation application of U.S. application Ser. No. 15/994,510, titled "TRANSPARENT ULTRAVIOLET PHOTODETECTOR", which was filed on May 31, 2018. The entire disclosures of U.S. application Ser. No. 15/994,510 are incorporated herein by reference.

BACKGROUND

The present invention generally relates to transparent ultraviolet photodetectors. More specifically, the present invention relates to a transparent ultraviolet photodetector configured to achieve a combination of low temperature processing and visible light transparency.

Photo-sensors or photodetectors are sensors that detect or sense light and/or other electromagnetic energy. A photodetector typically operates by converting incident light (i.e., photons) into charged carriers. These charged carriers are then directed into electrodes as current that is used to identify when photo detection has occurred. Photodetectors are used in a variety of applications, including, for example, applications involving plastic and flexible substrate platforms.

SUMMARY

Embodiments of the present invention are directed to a method of fabricating a visibly transparent, ultraviolet (UV) photodetector. A non-limiting example of the method includes laying a first electrode onto a substrate surface, the first electrode being formed of a carbon-based, single-layer material. A block is patterned over an end of the first electrode and portions of the substrate surface. The block is formed of a visibly transparent material that is able to be deposited into the block at 75° C.-125° C. In addition, the method includes masking a section of the block and exposed sections of the first electrode. A second electrode is laid onto an unmasked section of the block with an end of the second electrode laid onto the substrate surface. The second electrode is formed of the carbon-based, single-layer material.

Embodiments of the present invention are directed to method of fabricating a visibly transparent, ultraviolet (UV) photodetector. A non-limiting example of the method includes laying a first graphene electrode between a substrate surface and a first conductive contact. A zinc oxide (ZnO) block is patterned over an end of the first graphene electrode and proximal portions of the substrate surface at a distance from the first conductive contact. The non-limiting example of the method further includes masking complementary sections of the first conductive contact and the ZnO block and masking a region defined between the complementary sections of the first conductive contact and the ZnO block. A second graphene electrode is laid onto an unmasked section of the ZnO block with an end of the second graphene electrode being laid onto the substrate surface. A second conductive contact is assembled onto the end of the second graphene electrode.

Embodiments of the invention are directed to a visibly transparent, ultraviolet (UV) photodetector. A non-limiting example of the visibly transparent, UV photodetector includes a visibly transparent stack assembled on a substrate surface. In the non-limiting example of the visibly transparent, UV photodetector, the visibly transparent stack includes a zinc oxide (ZnO) block interleaved between first and second graphene electrodes.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 is a side view of a first graphene electrode assembled between a conductive contact and a substrate surface in accordance with embodiments of the invention;

FIG. 2 is a top-down view of the first graphene electrode, the conductive contact and the substrate surface of FIG. 1;

FIG. 3 is a side view of a zinc oxide (ZnO) block formed on the first graphene electrode of FIGS. 1 and 2 in accordance with embodiments of the invention;

FIG. 4 is a top-down view of the ZnO block formed on the first graphene electrode of FIG. 3;

FIG. 5 is a side view of a mask formed between the conductive contact and the ZnO block of FIGS. 3 and 4 in accordance with embodiments of the invention;

FIG. 6 is a top-down view of the mask of FIG. 5;

FIG. 7 is a side view of a second graphene electrode formed on the ZnO block and the substrate surface of FIGS. 5 and 6 in accordance with embodiments of the invention;

FIG. 8 is a top-down view of the second graphene electrode of FIG. 7;

FIG. 9 is a side view of an operation of a photodetector in accordance with embodiments of the invention.

Figure 10:
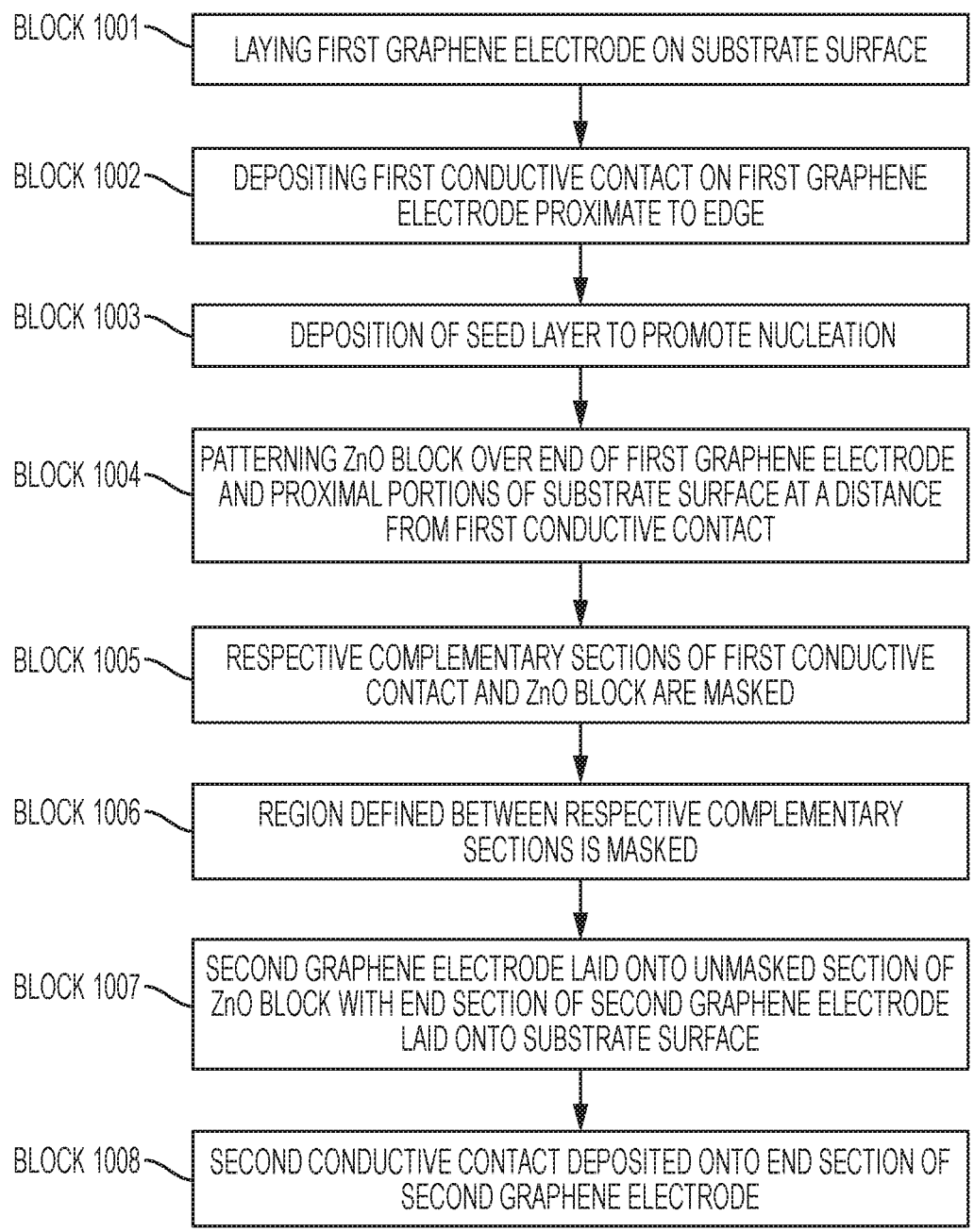
FIG. 10 is a flow diagram illustrating a method of fabricating a visibly transparent, ultraviolet (UV) photodetector in accordance with embodiments.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device, integrated circuit (IC) and photodetector fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices, semiconductor-based ICs and photodetectors are well known and so, in the interest of brevity, many conventional steps will only be mentioned briefly herein or will be omitted entirely without providing the well-known process details.

Turning now to an overview of technologies that are more specifically relevant to aspects of the invention, optically transparent ultraviolet (UV) photodetectors are conventionally made of wide band gap materials. These include, but are not limited to, silicon carbide (SiC), gallium phosphide (GaP) and gallium nitride (GaN). Relative to ZnO deposition, which can be accomplished at temperatures as low as 75° C.-125° C., deposition and/or growth of SiC, GaP and GaN are high temperature processes. Furthermore, GaP and GaN are less visibly transparent than ZnO within the visible light range (390 nm-700 nm). For comparison, at 400 nm, GaP loses all of its transparency while GaN loses approximately 75% of its transparency.

Turning now to an overview of the aspects of the invention, one or more embodiments of the invention address the above-described shortcomings of the prior art by presenting a pathway for fabricating visibly transparent, ultraviolet (UV) photodetectors with low temperature processes. The method utilizes a first material, such as graphene or another suitable material, as an electrode material and a second material, such as zinc oxide (ZnO) or another suitable material, as a main UV absorbing material to realize the photodetecting device. The first material (i.e., the graphene) is disposed in layers and provides for light transmission at 400 nm beyond what would be possible with conventional photodetectors. The first material (i.e., the graphene) is also transferred, instead of grown or deposited, onto the substrate of interest in an inherently low temperature process.

The photodetector having been made of the first and second materials (i.e., the graphene and the ZnO) will allow for a combination of low temperature processing and visible light transparency that is not achievable with other commonly-used materials. These characteristics make the proposed photodetector a candidate for applications involving plastic and flexible substrate platforms.

The above-described aspects of the invention address the shortcomings of the prior art in that they present a practical scheme to fabricate visibly transparent UV photodetectors based on graphene and ZnO. The resulting visibly transparent UV photodetectors have a structure in which incident UV radiation is absorbed by the second material (i.e., the ZnO) and an excited charge is transferred to electrodes of the first material (i.e., the graphene). This leads to a detectable increase in current through the device. The fabrication scheme includes a deposition of the second material onto the first material (i.e., a deposition of the ZnO onto the graphene) by atomic layer deposition with another layer of the first material placed on top of the second material (i.e., the graphene placed on top of the ZnO). This forms a visibly transparent first material/second material/first material (i.e., graphene/ZnO/graphene) stack.

For purposes of clarity and brevity, the following description will generally refer to the first material as being graphene and to the second material as being ZnO. This is done for clarity and brevity but it is to be understood that the first and second materials need not be limited to graphene and ZnO and that the disclosure as a whole is not limited to the graphene and ZnO embodiments.

Turning now to a more detailed description of aspects of the present invention, FIG. 1 is a side view of a substrate 10 having an upper surface 11, a first conductive contact 12 and a first graphene electrode 13 laid between the first conductive contact 12 and the upper surface 11 of the substrate 10. The substrate 10 and the upper surface 11 can be formed of visibly transparent materials including, but not limited to, visibly transparent glass and visibly transparent plastic. As used herein, visible transparency can refer, for example, to a property of a material whereby the material transmits light without appreciable scattering so that bodies lying beyond are visible to the human eye. The first graphene electrode 13 is positioned or laid on the upper surface 11 in an inherently low-temperature process. This inherently low-temperature process can be executed with respect to an entirety of the first graphene electrode 13 as a process that is selected from the group of processes consisting of mechanical exfoliation and a transfer process.

The first graphene electrode 13 can be initially grown on a copper foil. Once the first graphene electrode 13 is completely grown, the graphene surface can be coated with a layer of polymer resist, and the copper foil can be etched with the polymer resist providing structural support. The first graphene electrode 13 and the polymer resist are then transferred to a water-based solution. The first graphene electrode 13 and the polymer resist are then removed from the water-based solution and transferred to the substrate 10. The first graphene electrode 13 can be doped with either n-type or p-type dopants.

With reference to FIG. 2, once the first graphene electrode 13 is positioned or laid onto the upper surface 11, the first graphene electrode 13 can be formed into a first graphene electrode strip 130 that extends from an edge 110 of the upper surface 11 along a significant length of the upper surface 11. Formation of the first graphene electrode 13 into the first graphene electrode strip 130 can be executed by the formation of a mask, which can include polymethyl methacrylate (PMMA) resist material that is patterned by electron-beam lithography techniques, and a subsequent etch of sections of the first graphene electrode 13 that are exposed by the mask. The subsequent etch can be a reactive ion etch (RIE). Following completion of the etch process, the mask can be removed by, for example dissolution in acetone for PMMA resist material.

The first conductive contact 12 can include a material selected from the group consisting of titanium (Ti), palladium (Pd) and gold (Au). The first conductive contact 12 can be patterned and deposited on an end of the first graphene electrode strip 130 proximate to or coplanar with the edge 111 of the upper surface 11 by, for example, PMMA-based lift-off lithography. As shown in FIG. 2, a width of the first graphene electrode strip 130 is less than a corresponding width of the first conductive contact 12.

With reference to FIGS. 3 and 4, a ZnO block 14 is formed on an upper surface 131 of the first graphene electrode strip 130 at a distance from the first conductive contact 12. With the ZnO block 14 formed at the distance from the first conductive contact 12, respective complementary sections 120 and 140 of the first conductive contact 12 and the ZnO block 14 are separated by a distance D. The distance D defines a region 1214 between the first conductive contact 12 and the ZnO block 14 through which a corresponding section of the first graphene electrode strip 130 is exposed. The ZnO block 14 can be patterned and deposited by, for example, atomic layer deposition in a relatively low-temperature environment of between 75° C.-125° C. and PMMA-based lift-off lithography.

In some cases, atomic layer deposition (ALD) can be used to form the ZnO block 14. In such cases, the inert upper surface 131 of the first graphene electrode strip 13 could be required to be functionalized with a seed molecule layer to promote nucleation (see block 1003 of FIG. 10). The seed molecule could be nitrogen dioxide or another suitable molecule.

In accordance with alternative embodiments of the invention, it is to be understood that blocks of other materials could be used in addition to or instead of the ZnO block 14. For example, an indium tin oxide (ITO) block could be used.

As shown in FIG. 4, a width of the first graphene electrode strip 130 is less than a corresponding width of the ZnO block 14. In some cases, the respective widths of the first conductive contact 12 and the ZnO block 14 can be substantially similar.

With reference to FIGS. 5 and 6, a mask 15 is formed between the respective complementary sections 120 and 140 of the first conductive contact 12 and in the region 1214 such that the corresponding section of the first graphene electrode strip 130 is masked. The mask 15 can be an insulating hard mask and can be deposited by, for example, PMMA-based lift-off lithography. As shown in FIGS. 5 and 6, a width of the mask 15 is greater than a corresponding width of the first graphene electrode strip 130 and less than the respective corresponding widths of the first conductive contact 12 and the ZnO block 14. As such, in the region 1214, the upper surface 131 and the sidewalls of the first graphene electrode strip 130 at the corresponding section of the first graphene electrode strip 130 are masked by the mask 15.

With reference to FIG. 7, a second graphene electrode 16 is positioned or laid on an upper surface 141 of the ZnO block 14 and on the substrate surface 11 in an inherently low-temperature process. This inherently low-temperature process can be executed with respect to an entirety of the second graphene electrode 16 as a process that is selected from the group of processes consisting of a mechanical exfoliation process and a transfer process.

The second graphene electrode 16 can be initially grown on a copper foil. Once the second graphene electrode 16 is completely grown, the graphene surface can be coated with a layer of polymer resist, and the copper foil can be etched with the polymer resist providing structural support. The second graphene electrode 16 and the polymer resist are then transferred to a water-based solution. The second graphene electrode 16 and the polymer resist are then removed from the water-based solution and transferred to the ZnO block 14. The second graphene electrode 16 can be doped with either n-type or p-type dopants.

With reference to FIG. 8, once the second graphene electrode 16 is positioned or laid onto the upper surface 141 of the ZnO block 14 and the upper surface 11, the second graphene electrode 16 can be formed into a second graphene electrode strip 160 that extends from the upper surface 141, along a connective section 161 thereof, which extends at an angle from the upper surface 141 to the upper surface 11, and along an end section 162 thereof, which extends along the upper surface 11 to an edge 111. Formation of the second graphene electrode 16 into the second graphene electrode strip 160 can be executed by the formation of a mask, which can include polymethyl methacrylate (PMMA) resist material that is patterned by electron-beam lithography techniques, and a subsequent etch of sections of the second graphene electrode 16 that are exposed by the mask. The subsequent etch can be a RIE process. Following completion of the etch process, the mask can be removed by, for example dissolution in acetone for PMMA resist material. The mask 15 protects the first graphene electrode strip 130 during the processing of the second graphene electrode strip 160.

A second conductive contact 17 is then deposited on the end section 162 of the second graphene electrode strip 160. The second conductive contact 17 can include a material selected from the group consisting of titanium (Ti), palladium (Pd) and gold (Au). The second conductive contact 17 can be patterned and deposited on the end section 162 by, for example, PMMA-based lift-off lithography. As shown in FIG. 8, a width of the second graphene electrode strip 160 is less than respective corresponding widths of the first and second conductive contacts 12 and 17, the ZnO block 14 and the mask 15. Formation of the second conductive contact 17 completes a formation or assembly of photodetector 20 as a visibly transparent, UV photodetector.

With reference to FIG. 9, an operation of the photodetector 20 is illustrated. As shown in FIG. 9, visible light of varying wavelengths and UV light is incident on the photodetector 20. As the substrate 10, the first and second graphene electrode strips 130 and 160 and the ZnO block 14 are all transparent to visible light, the visible light of the varying wavelengths passes through the photodetector 20. Conversely, because the ZnO block 14 is able to absorb the UV light, the UV light does not pass through the photodetector 20 and instead is used in the generation of charge carriers that can be used in turn for the detection of UV light.

Thus, the photodetector 20 can be incorporated into a device, such as a sunshade, sunglasses or an optical element, that is actuatable in the presence of UV light. Such a device could include a processing unit which is configured to receive current from the photodetector 20 and which is configured to determine from that current that UV light is incident on the photodetector 20. The device could further include a servo control unit, which is coupled to the processing unit and which is operable by the processing unit to take an action relative to the incident UV light in accordance with the determination.

With reference to FIG. 10, a method of fabricating the photodetector 20 described above is provided. As shown in FIG. 10, the method includes laying the first graphene electrode 13 between substrate surface 11 (block 1001), and depositing the first conductive contact 12 on the first graphene electrode 13 proximate to the edge 110 (block 1002). The method also includes patterning the ZnO 14 block over an end of the first graphene electrode 13 and proximal (i.e., nearby and surrounding) portions of the substrate surface 11 at a distance from the first conductive contact 12 (block 1003). In some cases, the patterning of the ZnO block can be preceded by a deposition of a seed layer to promote nucleation (block 1004). Respective complementary sections 120 and 140 of the first conductive contact 12 and the ZnO block 14 are then masked (block 1005) as is the region 1214 defined between the respective complementary sections 120 and 140 (block 1006). Next, the second graphene electrode 16 is laid onto an unmasked section of the ZnO block 14 with end section 162 of the second graphene electrode 16 being laid onto the substrate surface 11 (block 1007). The second conductive contact 17 is deposited onto the end section 162 of the second graphene electrode 16 (block 1008).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device, integrated circuit (IC) fabrication and photodetector fabrication may or may not be described in detail herein. By way of background, however, a more general description of the semiconductor device, IC or photodetector fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device, an IC or a photodetector according to the present invention utilize a variety of individually known physical and chemical processes performed on a semiconductor (e.g., silicon), glass or plastic substrate, some of which are described in the immediately following paragraphs.

In general, the various processes used to form semiconductor-based devices (e.g., a photodetector) fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a photodetector, the method comprising:
   laying a first single-layer graphene electrode onto a substrate;
   patterning a visibly transparent block over an end of the first single-layer graphene electrode and portions of the substrate such that an edge of the visibly transparent block and an edge of the first single-layer graphene electrode are not coincident; and
   laying a second single-layer graphene electrode onto an unmasked section of the visibly transparent block with an end of the second single-layer graphene electrode laid onto the substrate.

2. The method according to claim 1, wherein:
   the substrate is visibly transparent; and
   the method further comprises depositing first and second conductive contacts comprising materials selected from the group consisting of titanium (Ti), palladium (Pd) and gold (Au) onto respective opposite ends of the first and second single-layer graphene electrodes.

3. The method according to claim 1, wherein the first and second single-layer graphene electrodes are doped with n-type or p-type dopants.

4. The method according to claim 1, wherein laying the first and second single-layer graphene electrodes comprises:
   executing a process selected from the group consisting of mechanically exfoliating, transferring and epitaxially growing the first and second single-layer graphene electrodes; and
   etching the first and second single-layer graphene electrodes to form first and second single-layer graphene electrode strips.

5. The method according to claim 1, wherein patterning the block, masking the section of the visibly transparent block, and masking the exposed sections of the first single-layer graphene electrode each comprises lithographic patterning and deposition.

6. The method according to claim 1 further comprising depositing a seed layer over the end of the first single-layer graphene electrode and the portions of the substrate prior to patterning the visibly transparent block.

7. A method of fabricating a visibly transparent, ultraviolet (UV) photodetector, the method comprising:
   laying a first single-layer graphene electrode between a substrate and a first contact;
   patterning a visibly transparent block over an end of the first single-layer graphene electrode and proximal portions of the substrate at a distance from the first contact;
   masking complementary sections of the first contact and the visibly transparent block;
   masking a region defined between the complementary sections of the first contact and the visibly transparent block;
   laying a second single-layer graphene electrode onto an unmasked section of the visibly transparent block with an end of the second single-layer graphene electrode being laid onto the substrate; and
   assembling a second contact onto the end of the second single-layer graphene electrode.

8. The method according to claim 7, wherein:
   the substrate is visibly transparent, and
   the first and second contacts comprise a material selected from the group consisting of titanium (Ti), palladium (Pd) and gold (Au).

9. The method according to claim 7, wherein the first and second single-layer graphene electrodes are doped with n-type or p-type dopants.

10. The method according to claim 7, wherein the laying of the first single-layer graphene electrode between the substrate and the first contact comprises:
- a process selected from the group of processes consisting of mechanically exfoliating, transferring and epitaxially growing the first single-layer graphene electrode; and
- etching the first single-layer graphene electrode into a first single-layer graphene electrode strip; and
- lithographically depositing the first contact onto an end of the first single-layer graphene electrode strip.

11. The method according to claim 7, wherein the patterning of the visibly transparent block, the masking of the complementary sections of the first contact and the visibly transparent block and the masking of the region between the complementary sections of the first contact and the visibly transparent block each comprises lithographic patterning and deposition.

12. The method according to claim 7, further comprising depositing a seed layer over the end of the first single-layer graphene electrode and the proximal portions of the substrate prior to the patterning of the visibly transparent block.

13. The method according to claim 7, wherein the laying of the second single-layer graphene electrode comprises:
- a process selected from the group of processes consisting of mechanically exfoliating, transferring and epitaxially growing the second single-layer graphene electrode; and
- etching the second single-layer graphene electrode into a second single-layer graphene electrode strip.

* * * * *